United States Patent
Shi

(10) Patent No.: US 10,894,746 B2
(45) Date of Patent: Jan. 19, 2021

(54) CERAMIC MATRIX COMPOSITE REINFORCED MATERIAL

(71) Applicant: Rolls-Royce Corporation, Indianapolis, IN (US)

(72) Inventor: Jun Shi, Carmel, IN (US)

(73) Assignee: Rolls-Royce Corporation, Indianapolis, IN (US)

(*) Notice: Subject to any disclaimer, the term of this patent is extended or adjusted under 35 U.S.C. 154(b) by 371 days.

(21) Appl. No.: 15/695,706

(22) Filed: Sep. 5, 2017

(65) Prior Publication Data
US 2018/0105471 A1 Apr. 19, 2018

Related U.S. Application Data

(60) Provisional application No. 62/410,219, filed on Oct. 19, 2016.

(51) Int. Cl.
*C04B 35/565* (2006.01)
*C23C 16/04* (2006.01)
(Continued)

(52) U.S. Cl.
CPC .......... *C04B 35/565* (2013.01); *C04B 35/117* (2013.01); *C04B 35/14* (2013.01); *C04B 35/16* (2013.01); *C04B 35/5607* (2013.01); *C04B 35/803* (2013.01); *C04B 35/806* (2013.01); *C04B 41/00* (2013.01); *C23C 16/045* (2013.01);
(Continued)

(58) Field of Classification Search
None
See application file for complete search history.

(56) References Cited

U.S. PATENT DOCUMENTS

| 5,736,222 A | 4/1998 | Childress |
|---|---|---|
| 6,436,507 B1 | 8/2002 | Pannell |

(Continued)

OTHER PUBLICATIONS

Clauß B., "Fibers for Ceramic Matrix Composites", 2008, 20 pgs. Applicant points out, in accordance with MPEP 609.04(a), that the year of publication, 2008, is sufficiently earlier than the effective U.S. filing date, 2017, so that the particular month of publication is not in issue.

(Continued)

*Primary Examiner* — David Sample
*Assistant Examiner* — Elizabeth Collister
(74) *Attorney, Agent, or Firm* — Shumaker & Sieffert, P.A.

(57) ABSTRACT

A CMC article may include a CMC substrate defining a major surface and a plurality of CMC reinforcing pins at least partially embedded in the CMC substrate. Each CMC reinforcing pin of the plurality of CMC reinforcing pins defines a respective long axis. The respective long axes may be oriented at an angle substantially perpendicular to the major surface of the CMC substrate. A method may include inserting a plurality of CMC reinforcing pins into a major surface of a ceramic fiber preform. Each CMC reinforcing pin of the plurality of CMC reinforcing pins defines a respective long axis. As the plurality of CMC reinforcing pins are inserted into the major surface, the respective long axes may be oriented at an angle substantially perpendicular to the major surface. The method also includes forming a matrix of material within pores of the ceramic fiber preform to form a CMC article.

19 Claims, 12 Drawing Sheets

(51) Int. Cl.
  *C23C 16/32* (2006.01)
  *C04B 35/14* (2006.01)
  *C04B 41/00* (2006.01)
  *C04B 35/80* (2006.01)
  *C04B 35/56* (2006.01)
  *C04B 35/16* (2006.01)
  *C04B 35/117* (2006.01)

(52) U.S. Cl.
  CPC ...... *C23C 16/325* (2013.01); *C04B 2235/524* (2013.01); *C04B 2235/526* (2013.01); *C04B 2235/5224* (2013.01); *C04B 2235/5228* (2013.01); *C04B 2235/5232* (2013.01); *C04B 2235/5244* (2013.01); *C04B 2235/5264* (2013.01); *C04B 2235/5268* (2013.01); *C04B 2235/614* (2013.01); *C04B 2235/616* (2013.01)

(56) References Cited

U.S. PATENT DOCUMENTS

| | | | |
|---|---|---|---|
| 2003/0059577 A1* | 3/2003 | Morrison | C04B 35/645 428/166 |
| 2005/0022921 A1* | 2/2005 | Morrison | C04B 37/005 156/89.11 |
| 2009/0019685 A1* | 1/2009 | Keith | B32B 7/08 29/469 |
| 2011/0027098 A1* | 2/2011 | Noe | C04B 35/573 416/241 B |

OTHER PUBLICATIONS

Choi et al., "Manufacturing of Z-Pinned Composite Laminates", Proceedings of ICCM 18, 2009, 6 pgs. Applicant points out, in accordance with MPEP 609.04(a), that the year of publication, 2009, is sufficiently earlier than the effective U.S. filing date, 2017, so that the particular month of publication is not in issue.

Chang et al., "Properties and failure mechanisms of z-pinned laminates in monotonic and cyclic tension", Composites Part A 37 (2006) 1501-1513, Nov. 9, 2005, 13 pgs.

Wei et al., "Tensile behavior of C/SiC with Z-pins Reinforcement", Retrieved from http://www.paper.edu.cn on Jul. 29, 2016, 6 pgs.

* cited by examiner

CMC Reinforcing Pins

CERAMIC MATRIX COMPOSITE REINFORCED MATERIAL

This application claims the benefit of U.S. Provisional Application No. 62/410,219 filed Oct. 19, 2016, which is incorporated herein by reference in its entirety.

TECHNICAL FIELD

The disclosure relates to ceramic matrix composites.

BACKGROUND

A ceramic matrix composite (CMC) includes ceramic fibers embedded in a ceramic matrix. CMCs may have excellent mechanical, physical, and chemical properties such as high fracture toughness, thermal shock resistance, and elongation resistance. CMCs may be used for a variety of applications such as gas turbine engines, brake discs, and the like. An example CMC is silicon carbide-fiber reinforced silicon carbide (SiC/SiC) composite.

SUMMARY

In some examples, the disclosure describes a method that includes inserting a plurality of ceramic matrix composite (CMC) reinforcing pins into a major surface of a ceramic fiber preform. Each CMC reinforcing pin of the plurality of CMC reinforcing pins defines a respective long axis. As the plurality of CMC reinforcing pins are inserted into the major surface, the respective long axes may be oriented at an angle substantially perpendicular to the major surface. The method also includes forming a matrix of material within pores of the ceramic fiber preform to form a CMC article. The matrix of material may substantially surround the ceramic fiber preform and at least a portion of each respective CMC reinforcing pin.

In some examples, the disclosure describes a CMC article that includes a CMC substrate defining a major surface and a plurality of CMC reinforcing pins at least partially embedded in the CMC substrate. Each CMC reinforcing pin of the plurality of CMC reinforcing pins defines a respective long axis. The respective long axes may be oriented at an angle substantially perpendicular to the major surface of the CMC substrate.

The details of one or more examples are set forth in the accompanying drawings and the description below. Other features, objects, and advantages of the disclosure will be apparent from the description and drawings, and from the claims.

DETAILED DESCRIPTION

Figure 1:
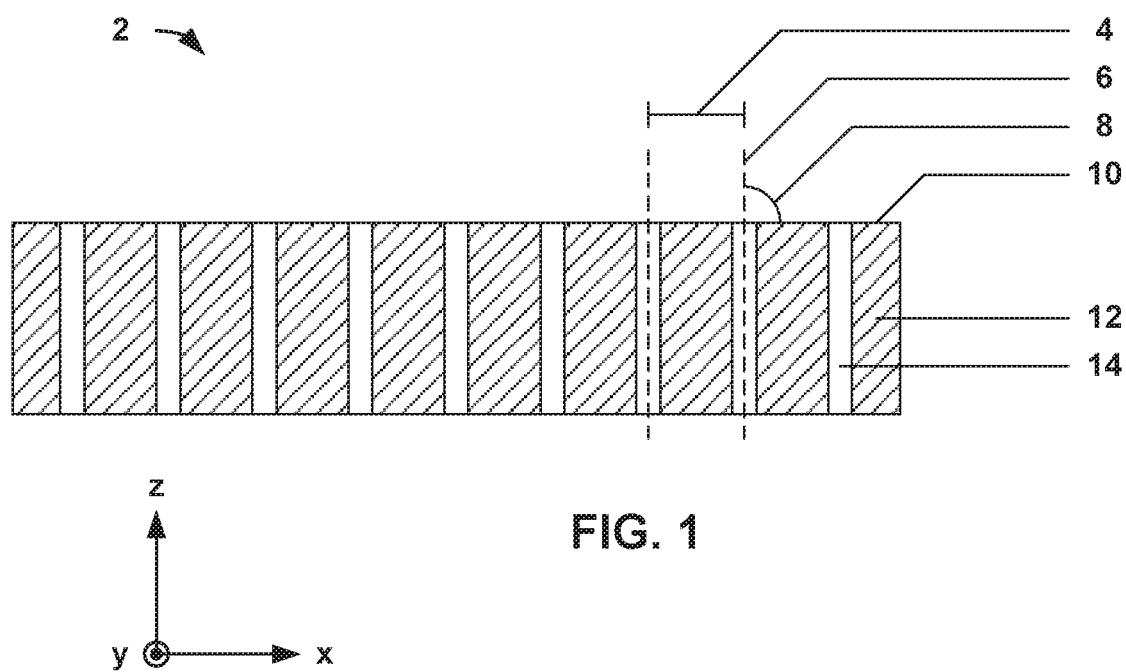
FIG. 1 is a conceptual and schematic cross-sectional diagram illustrating an example reinforced material that includes a ceramic matrix composite (CMC) substrate and a plurality of CMC reinforcing pins.

The disclosure describes a reinforced ceramic matrix composite (CMC) material and techniques for manufacturing the reinforced CMC material. For example, CMC substrates may be reinforced with CMC reinforcing pins to improve the inter-laminar strength of the CMC substrate compared to CMC substrates formed of reinforcement sheets or fabrics that do not include CMC reinforcing pins.

CMC articles formed from the reinforced material, such as CMC parts and coatings may be used in a variety of applications, such as combustor liners, turbine blades, turbine shrouds, turbine vanes, turbine flaps and seals, brake disks, and the like.

In some examples, the reinforced CMC material includes CMC reinforcing pins at least partially embedded in a CMC substrate and oriented substantially perpendicular to the surface of the CMC substrate. The CMC reinforcing pins may increase the inter-laminar shear strength, inter-laminar fracture toughness, and impact damage resistance of the CMC substrate for a more durable reinforced material. Each CMC reinforcing pin may have ceramic fibers that are substantially aligned and run along the length of the CMC reinforcing pin to provide shear resistance to the CMC substrate. The reinforced CMC material formed by the CMC substrate and CMC reinforcing pins may be lightweight, strong, and substantially composed of CMC material.

In some examples, the reinforced CMC material may also include a coating on the CMC substrate. In some examples, the coating may surround a portion of the CMC reinforcing pins that extend beyond the surface of the CMC substrate. The coating may provide the CMC article with resistance to thermal, environmental, corrosive, or other destructive forces. CMC reinforcing pins embedded in both the CMC substrate and the coating may increase the bond strength between the coating and the CMC substrate, help to prevent crack propagation in the coating, and resist delamination of the coating from the CMC substrate.

The reinforced CMC material described above may be manufactured by inserting the CMC reinforcing pins into a major surface of a ceramic fiber preform before forming a matrix around the ceramic fibers. Ceramic matrix material may deposit in pores of the ceramic fiber preform to substantially surround the ceramic fibers and at least a portion of the CMC reinforcing pins and form a reinforced CMC material. The CMC reinforcing pins may be inserted before forming the matrix in the pores of the ceramic fiber preform, rather than after forming the matrix, to reduce the amount of damage to the CMC substrate and increase adhesion of the CMC reinforcing pins with the CMC substrate.

In examples in which the CMC reinforcing pins are only partially inserted into the ceramic fiber preform, a coating may surround at least a portion of the CMC reinforcing pins. By first inserting the CMC reinforcing pins into the preform, and then forming the matrix material and coating around the CMC reinforcing pins, the CMC reinforcing pins may show greater adhesion to the CMC substrate and coating than CMC reinforcing pins that are inserted into a preformed CMC substrate and coating.

FIG. 1 is a conceptual and schematic cross-sectional diagram illustrating an example reinforced material 2 that includes a CMC substrate 12 and a plurality of CMC reinforcing pins 14. Reinforced material 2 may have any one of a variety of shapes and configurations. In some examples, material 2 is a layer of a manufactured article, such as a turbine blade, while in other examples, material 2 may form a part or a whole of the manufactured article. In some examples, material 2 is a section of manufactured article, such as a particular area on a substantially two-dimensional structure or a three-dimensional structure. For examples, if a particular area of a CMC article is subject to higher risk of delamination due to forces experiences by the particular area of the CMC article, the CMC article may include reinforced material 2 at the particular area, such as by inserting CMC reinforcing pins 14 at the particular area. Reinforced material 2 may be used for a variety of applications, such as a blade track, an airfoil, a blade, vane, a combustion chamber liner, and the like.

CMC substrate 12 defines a major surface 10. Major surface 10 may be, for example, the surface of a CMC article or coating that incorporates reinforced material 2. CMC substrate 12 may include ceramic reinforcement material and ceramic matrix material. In some examples, CMC substrate 12 may include a plurality of CMC layers (not shown). For example, a first CMC layer may be selected to carry an applied load, while a second CMC layer may be selected to transfer the applied load to an underlying component. In some examples, the composition of the ceramic matrix material is the same as the composition of the ceramic reinforcement material.

The composition of the ceramic matrix material may be selected to provide support to CMC substrate 12. The ceramic matrix material may include, but is not limited to, silicon carbide (SiC), silicon nitride ($Si_3N_4$), alumina ($Al_2O_3$), aluminosilicate (e.g., $Al_2SiO_5$), silica ($SiO_2$), molybdenum carbide ($Mo_2C$), and the like.

The composition, shape, size, and the like, of the ceramic reinforcement material may be selected to provide the desired properties to CMC substrate 12. In some examples, the ceramic reinforcement material is chosen to increase the toughness of a brittle matrix material. In some examples, the ceramic reinforcement material may provide structural support to CMC substrate 12. The ceramic matrix material may be chosen to modify a thermal conductivity, electrical conductivity, thermal expansion coefficient, hardness, or the like, of CMC substrate 12. The ceramic reinforcement material may include, but is not limited to, SiC, $Si_3N_4$, $Al_2O_3$, aluminosilicate, $SiO_2$, $Mo_2C$, and the like. The ceramic fibers may have a variety of configurations including, but not limited to, discontinuous forms such as whiskers, platelets, or particulates, or continuous forms, such as a continuous monofilament or multifilament weave.

CMC reinforcing pins 14 embedded in CMC substrate 12 may support CMC substrate 12 by providing through-thickness reinforcement and adhesion to CMC substrate 12 and other layers (not shown). CMC reinforcing pins 14 may include ceramic fibers and ceramic matrix material. The ceramic fibers may include, but are not limited to, SiC, $Al_2O_3$, aluminosilicate, and the like. The ceramic fibers may have a variety of configurations including, but not limited to, discontinuous forms such as whiskers, platelets, or particulates, or continuous forms, such as a continuous monofilament or multifilament weave. In some examples, the ceramic fibers are substantially one-dimensional rods, cords, or the like. The ceramic matrix materials may include, but are not limited to, SiC, $Si_3N_4$, $Al_2O_3$, aluminosilicate, $SiO_2$, $Mo_2C$, and the like. The ceramic fibers and ceramic matrix materials used in CMC substrate 12 and CMC reinforcing pins 14 may be the same, or they may be different.

Each CMC reinforcing pin 14 of the plurality of CMC reinforcing pins 14 defines a respective long axis 6. Each respective long axis 6 forms an angle 8 to major surface 10, and the respective angles 8 may be the same or may be different. Angle 8 of CMC reinforcing pins 14 may be substantially perpendicular to major surface 10. In some examples, angle 8 may be selected so that long axis 6 is substantially perpendicular to anticipated shear forces in reinforced material 2. By orienting the CMC reinforcing pins 14 substantially perpendicular to major surface 10, the CMC reinforcing pins 14 may resist horizontal and inter-laminar forces within CMC substrate 12 or a coating (not shown) that are perpendicular to CMC reinforcing pins 14.

For example, CMC substrate 12 may include at least two layers of reinforcement material or ceramic fibers, and CMC reinforcing pins 14 may extend through at least portion of each layer to resist delamination of the layers. In some examples, angle 8 is between 85° and 95° to major surface 10.

In some examples, at least some of the ceramic fibers are aligned substantially parallel to long axis 6 and run substantially through the length of each CMC reinforcing pin 14 to provide shear strength to CMC substrate 12. CMC reinforcing pin 14 may have a variety of shapes including, but not limited to, rods, rectangular pegs, and the like. The orientation and dimensions of the ceramic fibers within CMC reinforcing pin 14 are described in more detail in FIGS. 2A, 2B, and 2C.

Adjacent CMC reinforcing pins 14 may have a pin spacing 4 between the respective long axis 6 of each CMC reinforcing pin. Pin spacing 4 for a particular area of material 2 may be selected to provide particular support for that particular area. A section of material 2 with a smaller pin spacing 4 may have greater resistance to, for example, horizontal or inter-laminar forces. In some examples, pin spacing 4 is substantially uniform across material 2. For example, if material 2 is subject to similar forces along both an x-axis and a y-axis (where orthogonal x-, y-, and z-axes are shown in FIG. 1 for ease of description only), pin spacing 4 may be substantially uniform so that each dimension is similarly reinforced. In some examples, CMC reinforcing pins 14 may have a first pin spacing 4 along an x-axis and a second pin spacing 4 along a y-axis. For example, if material 2 is subject to a higher force along the x-axis than the y-axis, pin spacing 4 along the x-axis may be less than pin spacing 4 along the y-axis. In some examples, pin spacing 4 is varied across a material 2. For example, if a particular section of material 2 needs reinforcing, pin spacing 4 may be less for that particular section than other sections of material 2. The cumulative pin spacing 4 may have an average pin spacing for material 2 or a section of material 2. In some examples, the average pin spacing may be between 2 to 10 times a diameter of CMC reinforcing pin 14.

Figure 2A:
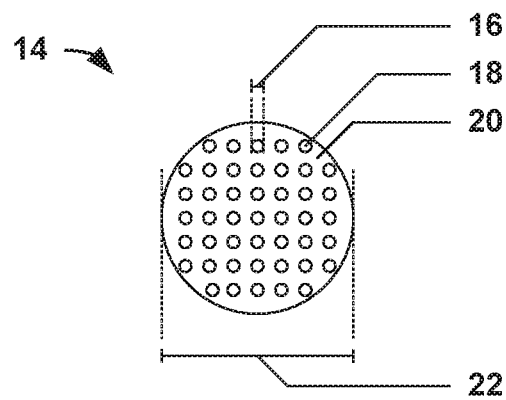
FIG. 2A is a conceptual and schematic cross-sectional diagram illustrating an example CMC reinforcing pin.

In the example of FIG. 1, reinforced material 2 includes CMC reinforcing pins 14 that provide through-thickness reinforcement to material 2. FIG. 2A is a conceptual and schematic cross-sectional diagram illustrating an example CMC reinforcing pin 14. CMC reinforcing pin 14 has a diameter 22. In some examples, diameter 22 is between 0.1 and 1 mm. Diameter 22 may be selected according to factors such as desired shear strength of CMC reinforcing pin 14, thickness of material 2 (FIG. 1), and length of CMC reinforcing pin 14. For example, as the length of CMC reinforcing pin 14 increases, diameter 22 may increase to support insertion of CMC reinforcing pin 14 into a ceramic fiber preform (not shown).

CMC reinforcing pin 14 includes a plurality of ceramic fibers 18 in ceramic matrix 20. In some examples, CMC reinforcing pin 14 includes between 10 and 1000 ceramic fibers 18. Each ceramic fiber 18 may have a diameter 16. In some examples, diameter 16 is between 10 and 500 μm. Ceramic fibers 18 and ceramic matrix 20 may be formed from materials similar to or substantially the same as those described above with reference to FIG. 1.

Figure 2B:
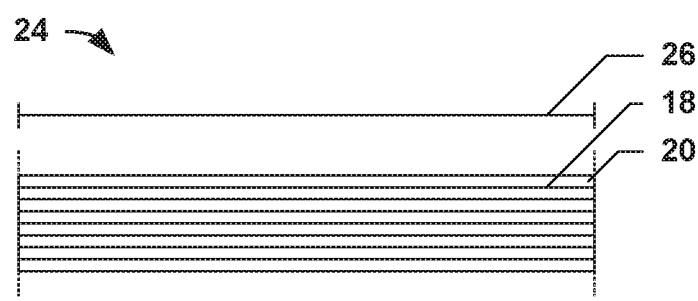
FIG. 2B is a conceptual and schematic cross-sectional diagram illustrating an example CMC rod.

In some examples, CMC reinforcing pin 14 of FIG. 2A may be formed from a larger CMC rod. FIG. 2B is a conceptual and schematic cross-sectional diagram illustrating an example CMC rod 24 used as an intermediate during fabrication of CMC reinforcing pin 14. CMC rod 24 includes a plurality of ceramic fibers 18 in ceramic matrix 20, as described above. CMC rod 24 has a length 26. In some examples, length 26 is between 10 and 500 mm, while in other examples, length 26 is between 25 and 200 mm.

Figure 2C:
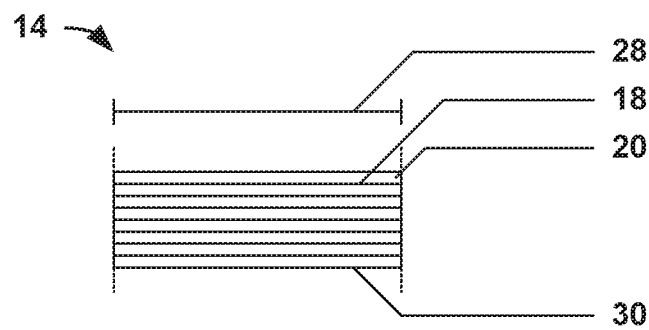
FIG. 2C is a conceptual and schematic cross-sectional diagram illustrating an example CMC reinforcing pin.

The example CMC rod 24 of FIG. 2B may be cut into smaller CMC reinforcing pins 14. FIG. 2C is a conceptual and schematic cross-sectional diagram illustrating an example CMC reinforcing pin 14 from CMC rod 24 of FIG. 2B. In some examples, CMC rod 24 may be cut to form CMC reinforcing pin 14 having at least one lateral surface 30. CMC reinforcing pin 14 includes a plurality of ceramic fibers 18 in ceramic matrix 20, as described above. CMC reinforcing pin 14 has a length 28 which may be a section of length 26 of CMC rod 24 of FIG. 2B. In some examples, length 28 is between 0.05 and 10 mm. In some examples, length 28 may be selected according to a thickness of CMC substrate 12. For example, length 28 and a thickness of CMC substrate 12 may be the same. In other examples, such as an example material 2 with a coating on CMC substrate 12, length 28 may be at least a thickness of the coating.

Figure 3:
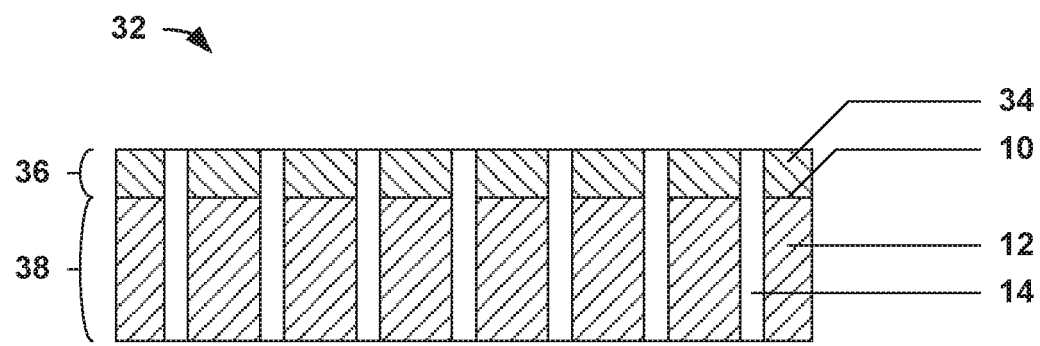
FIG. 3 is a conceptual and schematic cross-sectional diagram illustrating an example material that includes a CMC substrate, a coating, and a plurality of CMC reinforcing pins.

In some examples, reinforced material 2 of FIG. 1 may also include a coating. For example, a coating may provide reinforced material 2 with resistance to thermal, environmental, corrosive, or other destructive forces. FIG. 3 is a conceptual and schematic cross-sectional diagram illustrating an example material 32 that includes CMC substrate 12, coating 34, and a plurality of ceramic matrix composite (CMC) reinforcing pins 14. CMC substrate 12 may include a major surface 10 on which coating 34 is located. CMC substrate 12, CMC reinforcing pins 14, and major surface 10 may be similar to or substantially the same as the corresponding structures described in FIG. 1, and may include an angle (not shown) between CMC reinforcing pins 14 and major surface 10 similar to angle 8 of FIG. 1 and a pin spacing (not shown) between CMC reinforcing pins 14 similar to pin spacing 4 of FIG. 1.

Coating 34 may be selected to provide protective or functional properties to reinforced material 32. Coating 34 may include, for example, an environmental barrier coating (EBC), a thermal barrier coating (TBC), a calcia-magnesia-aluminosilicate (CMAS)-resistant layer, an abradable coating, or the like. In some examples, a single coating 34 may perform two or more of these functions. For example, an EBC may provide environmental protection, thermal protection, and CMAS-resistance to CMC substrate 12. In some examples, instead of including a single coating 34, material 32 may include a plurality of overlying coating, such as at least one EBC, at least one TBC layer, at least one CMAS-resistant layer, at least one abradable coating, or combinations thereof.

In some examples, coating 34 may include a bond coat that includes any useful material to improve adhesion between CMC substrate 12 and subsequent layers applied to the bond coat. For example, the bond coat may be formulated to exhibit desired chemical or physical attraction between CMC substrate 12 and any subsequent coating applied to the bond coat. In some examples, the bond coat may include silicon metal, alone, or mixed with at least one other constituent including, for example, at least one of a transition metal carbide, a transition metal boride, or a transition metal nitride. Representative transition metals include, for example, Cr, Mo, Nb, W, Ti, Ta, Hf, or Zr. In some examples, the bond coat may additionally or alternatively include mullite (aluminum silicate, $Al_6Si_2O_{13}$), silica, a silicide, or the like, alone, or in any combination (including in combination with one or more of silicon metal, a transition metal carbide, a transition metal boride, or a transition metal nitride).

Additionally or alternatively, coating 34 may include an EBC, which may provide environmental protection, thermal protection, and/or CMAS-resistance to CMC substrate 12. An EBC may include materials that are resistant to oxidation or water vapor attack, and/or provide at least one of water vapor stability, chemical stability and environmental durability to CMC substrate 12. In some examples, the EBC may be used to protect CMC substrate 12 against oxidation and/or corrosive attacks at high operating temperatures. An EBC coating may include at least one of a free rare earth oxide, a rare earth silicate, an aluminosilicate, or an alkaline earth aluminosilicate. For example, an EBC coating may include mullite, barium strontium aluminosilicate (BSAS), barium aluminosilicate (BAS), strontium aluminosilicate (SAS), at least one free rare earth oxide, at least one rare earth monosilicate ($RE_2SiO_5$, where RE is a rare earth element), at least one rare earth disilicate ($RE_2Si_2O_7$, where RE is a rare earth element), or combinations thereof. The rare earth element in the at least one free rare earth oxide, the at least one rare earth monosilicate, or the at least one rare earth disilicate may include at least one of Lu (lutetium), Yb (ytterbium), Tm (thulium), Er (erbium), Ho (holmium), Dy (dysprosium), Tb (terbium), Gd (gadolinium), Eu (europium), Sm (samarium), Pm (promethium), Nd (neodymium), Pr (praseodymium), Ce (cerium), La (lanthanum), Y (yttrium), or Sc (scandium). In some examples, the at least one rare earth oxide includes an oxide of at least one of Yb, Y, Gd, or Er.

In some examples, an EBC coating may include at least one free rare earth oxide and free alumina, at least one free rare earth oxide and free silica, or at least one free rare earth oxide, free silica, and free alumina. In some examples, an EBC coating may include an additive in addition to the primary constituents of the EBC coating. For example, an EBC coating may include at least one of $TiO_2$, $Ta_2O_5$, $HfSiO_4$, an alkali metal oxide, or an alkali earth metal oxide. The additive may be added to the EBC coating to modify one or more desired properties of the EBC coating. For example, the additive components may increase or decrease the reaction rate of the EBC coating with CMAS, may modify the viscosity of the reaction product from the reaction of CMAS and the EBC coating, may increase adhesion of the EBC coating to CMC substrate 12, may increase or decrease the chemical stability of the EBC coating, or the like.

In some examples, the EBC coating may be substantially free (e.g., free or nearly free) of hafnia and/or zirconia. Zirconia and hafnia may be susceptible to chemical attack by CMAS, so an EBC coating substantially free of hafnia and/or zirconia may be more resistant to CMAS attack than an EBC coating that includes zirconia and/or hafnia.

In some examples, the EBC coating may have a dense microstructure, a columnar microstructure, or a combination of dense and columnar microstructures. A dense microstructure may be more effective in preventing the infiltration of CMAS and other environmental contaminants, while a columnar microstructure may be more strain tolerant during thermal cycling. A combination of dense and columnar microstructures may be more effective in preventing the infiltration of CMAS or other environmental contaminants than a fully columnar microstructure while being more strain tolerant during thermal cycling than a fully dense microstructure. In some examples, an EBC coating with a dense microstructure may have a porosity of less than about 20 vol. %, such as less than about 15 vol. %, less than 10 vol. %, or less than about 5 vol. %, where porosity is measured as a percentage of pore volume divided by total volume of the EBC coating.

In some examples, the EBC may act as a thermal barrier coating (TBC). The TBC may include at least one of a variety of materials having a relatively low thermal conductivity, and may be formed as a porous or a columnar structure in order to further reduce thermal conductivity of the TBC and provide thermal insulation to CMC substrate 12. In some examples, the TBC may include materials such as ceramic, metal, glass, pre-ceramic polymer, or the like. In some examples, the TBC may include silicon carbide, silicon nitride, boron carbide, aluminum oxide, cordierite, molybdenum disilicide, titanium carbide, stabilized zirconia, stabilized hafnia, or the like.

Additionally or alternatively, coating 34 may include an abradable layer. The abradable layer may include at least one of a free rare earth oxide, a rare earth silicate, an aluminosilicate, or an alkaline earth aluminosilicate. For example, an EBC coating may include mullite, barium strontium aluminosilicate (BSAS), barium aluminosilicate (BAS), strontium aluminosilicate (SAS), at least one free rare earth oxide, at least one rare earth monosilicate ($RE_2SiO_5$, where RE is a rare earth element), at least one rare earth disilicate ($RE_2Si_2O_7$, where RE is a rare earth element), or combinations thereof.

The abradable layer may be porous. Porosity of the abradable layer may reduce a thermal conductivity of the abradable layer and/or may affect the abradability of the abradable layer. In some examples, the abradable layer includes porosity between about 10 vol. % and about 50 vol. %. In other examples, the abradable layer includes porosity between about 15 vol. % and about 35 vol. %, or about 20 vol. %. Porosity of the abradable layer is defined herein as a volume of pores or cracks in the abradable layer divided by a total volume of the abradable layer (including both the volume of material in the abradable layer and the volume of pores/cracks in the abradable layer).

At least one CMC reinforcing pin 14 of the plurality of CMC reinforcing pins 14 may include a first section 36 embedded in coating 34 and a second section 38 embedded in CMC substrate 12. First section 36 and second section 38 may reinforce CMC substrate 12 and/or increase adhesion between CMC substrate 12 and coating 34. In some examples, first section 36 and/or second section 38 may be substantially equal to the respective thicknesses of coating 34 and CMC substrate 12. For example, each CMC reinforcing pin 14 may reinforce material 32 through the entire thickness of material 32. In other examples, first section 36 and/or second section 38 may be less than the respective thicknesses of coating 34 and CMC substrate 12. For example, CMC reinforcing pins 14 may promote adhesion near the interface between CMC substrate 12 and coating 34, but first section 36 may be shorter than the thickness of coating 34. In some examples, first section 36 and/or second section 38 are greater than the relative thickness of coating 34 and CMC substrate 12, respectively. For example, CMC reinforcing pins 14 may promote adhesion to either a component underlying CMC substrate 12 or a material, such as another coating, overlaying coating 34.

Figure 4:
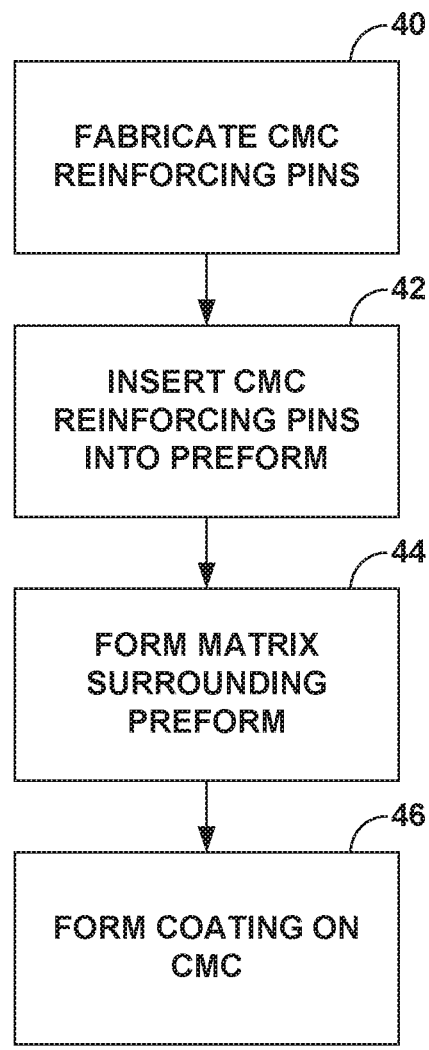
FIG. 4 is a flow diagram illustrating an example technique for manufacturing a reinforced material including a CMC substrate and a plurality of CMC reinforcing pins.

Reinforced materials 2 and 32 of FIG. 1 and FIG. 3, respectively, may be formed, for example, by a technique of FIG. 4. FIG. 4 is a flow diagram illustrating an example technique for manufacturing a material including a ceramic matrix composite (CMC) substrate 12 and CMC reinforcing pins 14. While the technique of FIG. 4 is described with concurrent reference to the conceptual diagram of FIGS. 1-3, in other examples, the technique of FIG. 4 may be used to form another reinforced material.

In some examples, the technique of FIG. 4 may optionally include fabricating CMC reinforcing pins 14 (40). Fabricating CMC reinforcing pins 14 may include impregnating a reinforcement material or plurality of ceramic fibers with a matrix material. Further details regarding fabrication of CMC reinforcing pins 14 will be described with reference to FIGS. 8-11.

The technique of FIG. 4 includes inserting a plurality of CMC reinforcing pins 14 into a major surface 10 of a ceramic fiber preform (42). Each CMC reinforcing pin 14 in the plurality of CMC reinforcing pins 14 defines a respective long axis 4. As the plurality of CMC reinforcing pins 14 are inserted into the major surface, the respective long axes 4 may be oriented at an angle 8 to major surface 10. In some examples, angle 8 may be between about 85 and about 95 degrees.

In some examples, CMC reinforcing pins 14 may be inserted into the ceramic fiber preform from a foam preform. The foam preform may act as a guide for introducing CMC reinforcing pins 14 into the ceramic fiber preform. Prior to insertion, CMC reinforcing pins 14 may be positioned in the foam preform at a particular angle, such as angle 8, and a particular pin spacing, such as pin spacing 4. The foam preform may be positioned on the surface of the ceramic fiber preform. An insertion force, such as ultrasonic vibration and mechanical force, may apply pressure and vibration to at least the CMC reinforcing pins 14 to insert CMC reinforcing pins 14 into the ceramic fiber preform. In some examples, a vibration may assist in inserting CMC reinforcing pins 14 into the ceramic fiber preform with reduced damage to the ceramic fiber preform. As CMC reinforcing pins 14 are inserted into the ceramic fiber preform, the foam preform supports CMC reinforcing pins 14 and collapses as CMC reinforcing pins 14 embed into the ceramic fiber preform. Once CMC reinforcing pins 14 are inserted to the desired depth, the foam preform may be removed, such as by peeling or dissolution. In some examples, second section 38 of CMC reinforcing pins 14 may be inserted into the ceramic fiber preform.

The foam preform may be configured based on, for example, the length of CMC reinforcing pins 14 and the desired thickness of CMC substrate 12. In some examples, the height of the foam preform and the length of CMC reinforcing pins 14 may be substantially the same, while in other examples, the height of the foam preform and the length of CMC reinforcing pins 14 may be different. A variety of foams may be used for the foam preform including, but not limited to, high density foam and low density foam. In some examples, the foam preform may include more than one type of foam. For example, the foam preform may have a layer of high density foam contacting the major surface of the ceramic fiber preform and a layer of low density foam on the layer of high density foam.

The ceramic fiber preform may include ceramic fibers that form a reinforcing network. The ceramic fibers may include, but are not limited to, SiC, $Si_3N_4$, $Al_2O_3$, aluminosilicate, $SiO_2$, and the like. The ceramic fibers may have a variety of configurations including, but not limited to, discontinuous forms such as whiskers, platelets, or particulates, or continuous forms, such as a continuous monofilament or multifilament weave. Insertion of CMC reinforcing pins 14 into a ceramic fiber preform will be described in further detail in FIGS. 5-7.

Figure 5A:
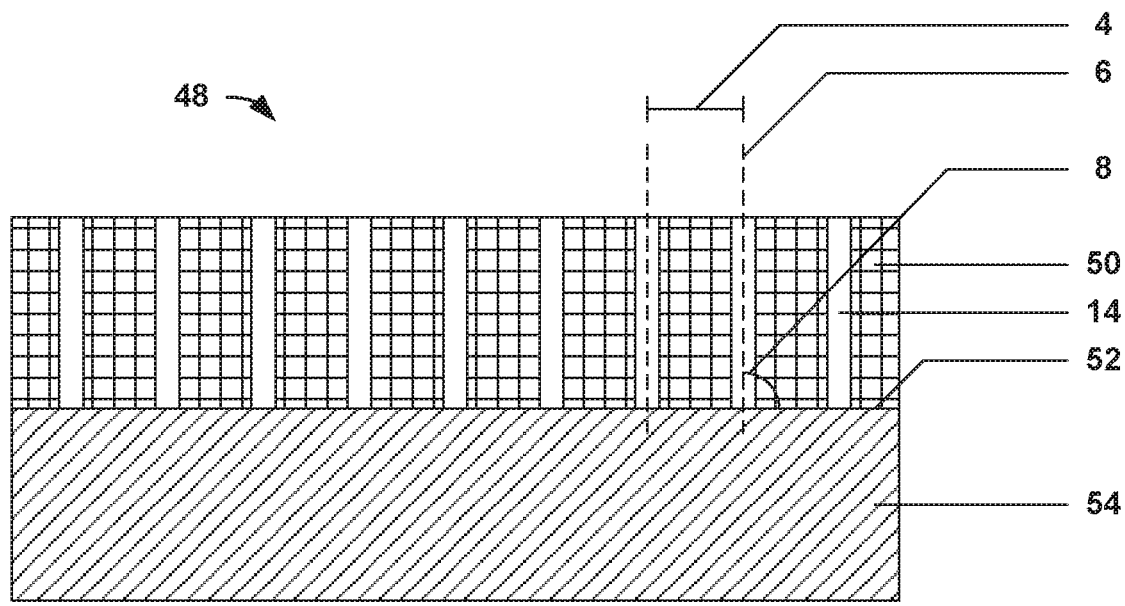
FIG. 5A is a conceptual and schematic cross-sectional diagram illustrating an example material that includes a ceramic fiber preform and a plurality of CMC reinforcing pins positioned in a foam preform.
Figure 5B:
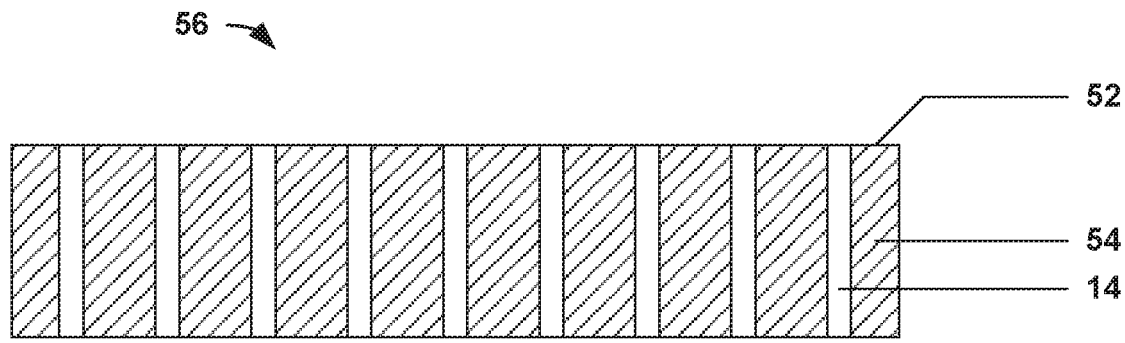
FIG. 5B is a conceptual and schematic cross-sectional diagram illustrating an example reinforced ceramic fiber preform that includes a ceramic fiber preform and a plurality of CMC reinforcing pins fully embedded through a full depth of the ceramic fiber preform.

In some examples, CMC reinforcing pins 14 of FIGS. 1 and 3 may be inserted into the ceramic fiber preform to fully extend through a full thickness of the ceramic fiber preform. FIGS. 5A and 5B are conceptual and schematic cross-sectional diagrams that illustrate full insertion of CMC reinforcing pins 14 into a full thickness of a ceramic fiber preform 54 to form a reinforced ceramic fiber preform 56. FIG. 5A illustrates a pre-insertion material 48 that includes CMC reinforcing pins 14 disposed in foam preform 50 at a pin spacing 4. Foam preform 50 is positioned on a major surface 52 of ceramic fiber preform 54. Each respective long axis 6 of CMC reinforcing pins 14 forms angle 8 with major surface 52 of ceramic fiber preform 54. CMC reinforcing pins 14 may be inserted into ceramic fiber preform 54, as explained in step 42 of FIG. 4 above, e.g., by applying an insertion force, such as ultrasonic vibration and mechanical force, to at least CMC reinforcing pins 14 to insert CMC reinforcing pins 14 into ceramic fiber preform 54. FIG. 5B illustrates a post-insertion reinforced ceramic fiber preform 56 having CMC reinforcing pins 14 disposed in ceramic fiber preform 54. CMC reinforcing pins 14 extend substantially fully through ceramic fiber preform 54, with CMC reinforcing pins 14 substantially fully embedded in ceramic fiber preform 54.

Figure 6A:
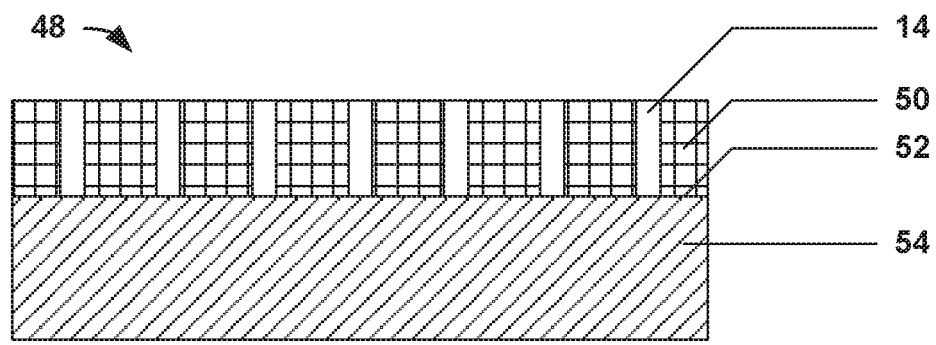
FIG. 6A is a conceptual and schematic cross-sectional diagram illustrating an example material that includes a ceramic fiber preform and a plurality of CMC reinforcing pins positioned in a foam preform.
Figure 6B:
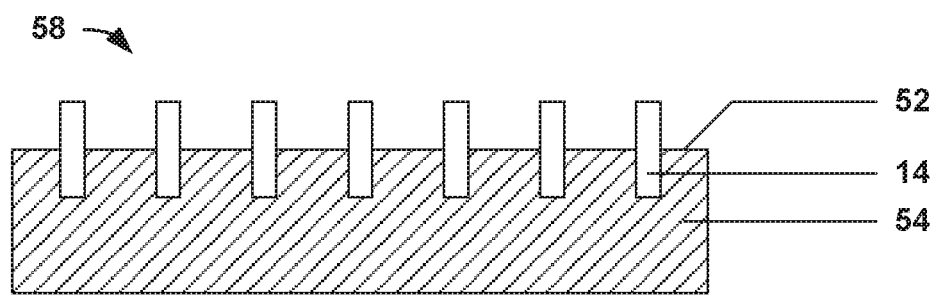
FIG. 6B is a conceptual and schematic cross-sectional diagram illustrating an example reinforced ceramic fiber preform that includes a ceramic fiber preform and a plurality of CMC reinforcing pins partially embedded to a partial depth of the ceramic fiber preform.
Figure 6C:
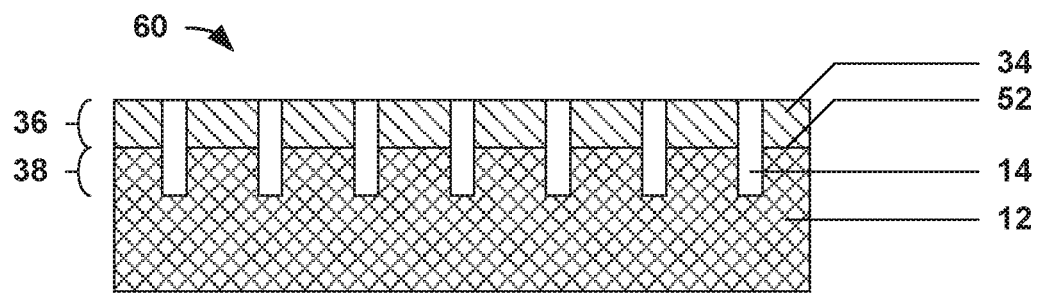
FIG. 6C is a conceptual and schematic cross-sectional diagram illustrating an example reinforced material that includes a ceramic fiber preform, a coating, and a plurality of CMC reinforcing pins partially embedded to a partial depth of the ceramic fiber preform and partially embedded in the coating.

In some examples, CMC reinforcing pins 14 of FIGS. 1 and 3 may partially extend through a partial thickness of a reinforced material. Partial insertion of CMC reinforcing pins 14 may be used, for example, for articles that include additional layers on CMC substrate 12 of FIG. 1 or FIG. 3, such as coatings. FIGS. 6A, 6B, and 6C are conceptual and schematic cross-sectional diagrams that illustrate partial insertion of CMC reinforcing pins 14 into a partial thickness of ceramic fiber preform 54 to form a reinforced material 60. FIG. 6A illustrates the pre-insertion material of FIG. 5A, except that the length of CMC reinforcing pins 14 and thickness of foam preform 50 are less than the thickness of ceramic fiber preform 54. CMC reinforcing pins 14 are inserted partially into major surface 52 of ceramic fiber preform 54 and foam preform 50 is removed, as explained in step 42 of FIG. 4 above. FIG. 6B illustrates a post-insertion reinforced ceramic fiber preform 58 having CMC reinforcing pins 14 partially inserted through a partial thickness of ceramic fiber preform 54. FIG. 6C illustrates a further processed reinforced material 60 formed by, for example, steps 44 and 46 of FIG. 4, described below. A matrix may be formed in reinforced ceramic fiber preform 58 to form reinforced CMC substrate 12. Coating 34 may be deposited on CMC substrate 12 to form reinforced material 60 of FIG. 6C, as explained in step 46 of FIG. 4 above. CMC reinforcing pins 14 may include a first section 36 embedded in coating 34 and a second section 38 embedded in CMC substrate 12, where the second section does not extend through CMC substrate 12.

Figure 7A:
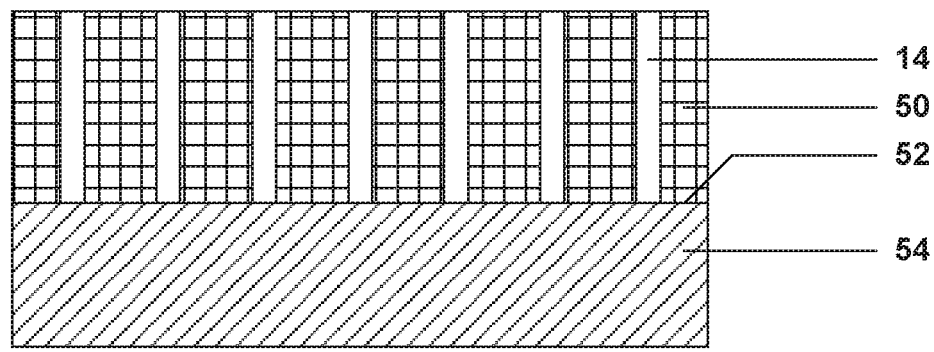
FIG. 7A is a conceptual and schematic cross-sectional diagram illustrating an example material that includes a ceramic fiber preform and a plurality of CMC reinforcing pins positioned in a foam preform.
Figure 7B:
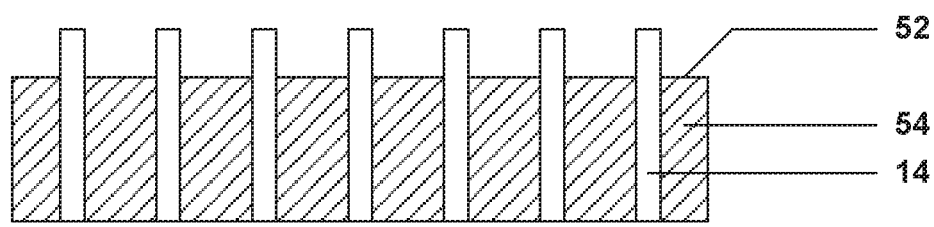
FIG. 7B is a conceptual and schematic cross-sectional diagram illustrating an example reinforced ceramic fiber preform that includes a ceramic fiber preform and a plurality of CMC reinforcing pins partially embedded to a full depth of the ceramic fiber preform.
Figure 7C:
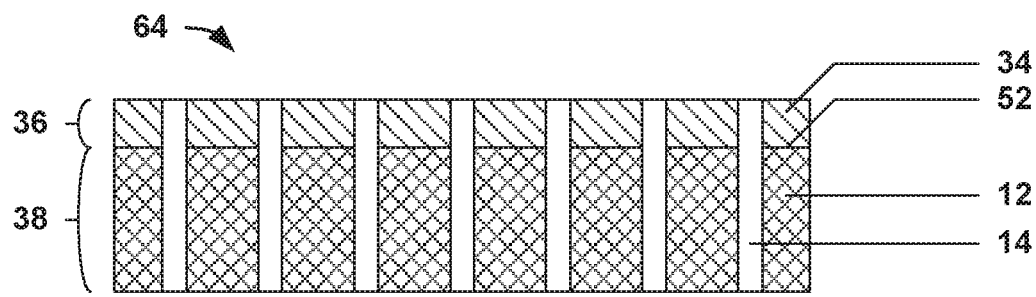
FIG. 7C is a conceptual and schematic cross-sectional diagram illustrating an example reinforced material that includes a ceramic fiber preform, a coating, and a plurality of CMC reinforcing pins partially embedded to a full depth of the ceramic fiber preform and partially embedded in the coating.

In some examples, CMC reinforcing pins 14 of FIGS. 1 and 3 may partially extend through a full thickness of a reinforced material. Partial insertion of CMC reinforcing pins 14 into a full thickness of ceramic fiber preform may be used, for example, for full through-reinforcement of an article that includes additional layers. FIGS. 7A, 7B, and 7C are conceptual and schematic cross-sectional diagrams that illustrate partial insertion of CMC reinforcing pins 14 into a full thickness of ceramic fiber preform 54 to form a reinforced material 64. FIG. 7A illustrates the pre-insertion material of FIG. 5A, except that the length of CMC reinforcing pins 14 and thickness of foam preform 50 are greater than the thickness of ceramic fiber preform 54. CMC reinforcing pins 14 are inserted fully into major surface 52 of ceramic fiber preform 54 and foam preform 50 is removed, as explained in step 42 of FIG. 4 above. FIG. 7B illustrates a post-insertion reinforced ceramic fiber preform 62 having CMC reinforcing pins 14 partially inserted through a full thickness of ceramic fiber preform 54. FIG. 7C illustrates a further processed reinforced material 64 formed by, for example, steps 44 and 46 of FIG. 4, described below. A matrix may be formed in reinforced ceramic fiber preform 62 to form reinforced CMC substrate 12. Coating 34 may be deposited on CMC substrate 12 to form reinforced material 60 of FIG. 7C. CMC reinforcing pins 14 may include a first section 36 embedded in coating 34 and a second section 38 embedded in CMC substrate 12, where the second section extends through CMC substrate 12.

The technique of FIG. 4 further includes forming a matrix of material within pores of the ceramic fiber preform (44) to form CMC substrate 12. A variety of techniques may be used to form the matrix of material including, but not limited to, liquid infiltration and pyrolysis, melt processing, sintering, or gaseous infiltration. The matrix may include, but is not limited to, SiC, $Si_3N_4$, $Al_2O_3$, aluminosilicate, $SiO_2$, and the like. In some examples, the matrix material precursors are in gaseous form. A variety of gaseous matrix materials may be used including, but not limited to: hydrocarbon gas, such as methane and propane, for a carbon matrix or coating; carbosilanes, such as methyltrichlorosilane ($CH_3SiCl_3$), for a silicon carbide matrix or coating; silanes, such as dichlorosilane and tetraethylorthosilicate, for a silicon matrix or coating; aluminum halides, such as aluminum chloride ($AlCl_3$), for an alumina ($Al_2O_3$) matrix or coating; metal halides, such as tungsten hexafluoride and titanium pentachloride; metal carbonyls, such as nickel carbonyl; any other precursor suitable for forming a selected matrix coating; or the like. In some examples, the CMC substrate precursors are in liquid form. A variety of liquid matrix materials may be used including, but not limited to, hydrocarbon polymers for pyrolysis, carbon and silicon carbide slurry for slurry infiltration, alumina or mullite for sintering, molten silicon for melt infiltration, or the like.

In some examples, the technique of FIG. 4 may optionally include forming coating 34 on CMC substrate 12 (46). In examples in which first section 36 of CMC reinforcing pins 14 extend from major surface 52 of ceramic matrix preform 54, coating 34 may surround first section 36 of CMC reinforcing pins 14 to form, for example, material 32. A variety of deposition and coating techniques may be used including, but not limited to, physical vapor deposition, chemical vapor deposition, sol-gel process deposition, plasma spraying, and the like.

Figure 8:
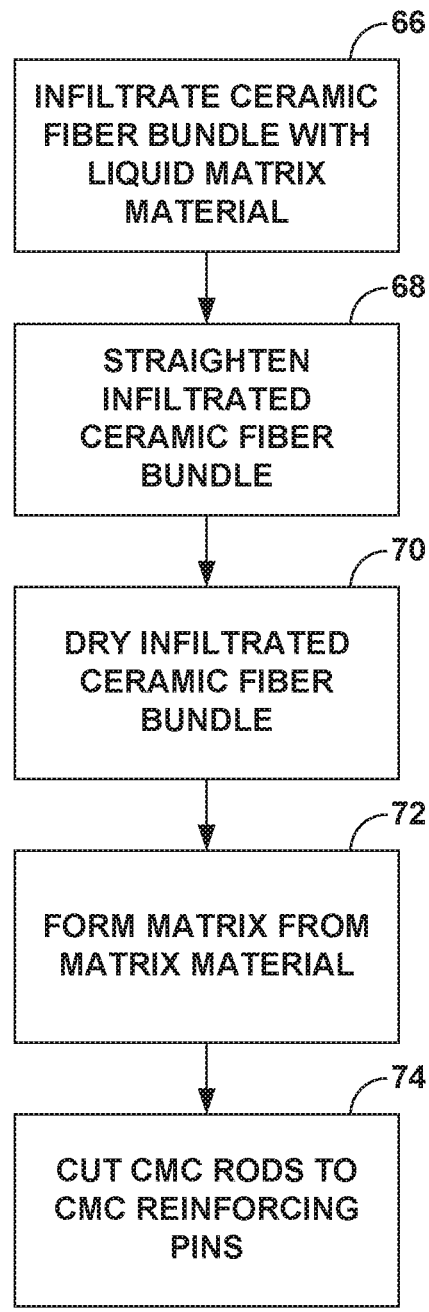
FIG. 8 is a flow diagram illustrating an example technique for manufacturing CMC reinforcing pins using liquid infiltration.
Figure 9:
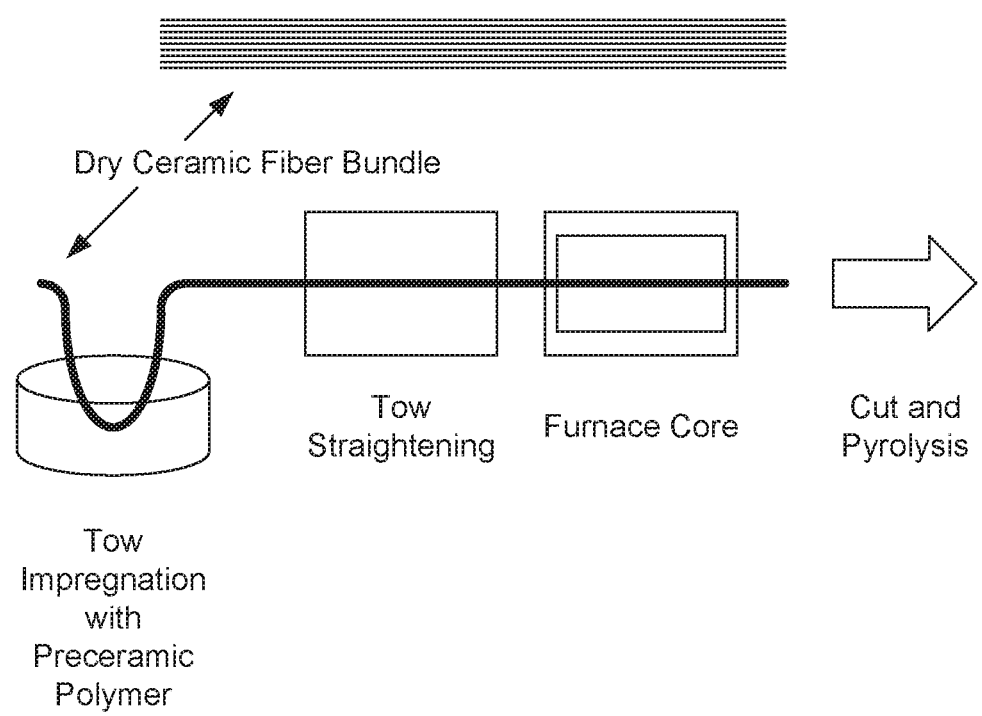
FIG. 9 is a conceptual and schematic cross-sectional diagram illustrating an example technique for manufacturing CMC reinforcing pins using liquid infiltration.

CMC reinforcing pins 14 of FIGS. 2A-C may be manufactured so that the ceramic fibers are aligned substantially parallel to a long axis of the respective pin and run substantially through the length of each CMC reinforcing pin 14 to provide shear support to CMC substrate 12 once inserted. To achieve this alignment, ceramic fiber bundles may be straightened, infiltrated, and cured to form CMC rods, which may be subsequently cut into CMC reinforcing pins. In some instances, it may be desirable to use lower temperatures and pressures to manufacture the rods, such as those used in liquid infiltration. FIG. 8 is a flow diagram illustrating an example technique for manufacturing CMC reinforcing pins 14 using liquid infiltration. FIG. 9 is a diagram illustrating an example technique for manufacturing CMC reinforcing pins using liquid infiltration. FIG. 8 and FIG. 9 will be referred to concurrently to illustrate aspects of FIG. 8 and FIG. 9.

The technique may include infiltrating a ceramic fiber bundle with liquid matrix material (66). In some examples, the ceramic fiber bundle may be dipped into a medium of ceramic matrix material or ceramic matrix material precursor. For example, FIG. 9 illustrates tow impregnation of a dry ceramic fiber bundle with preceramic polymer. For exemplary techniques using pyrolysis, such as FIG. 9, the medium may be a preceramic polymer solution. For exemplary techniques using Si melt infiltration, the medium may be a C/SiC slurry. For exemplary techniques using sintering, the medium may be a sol laden with oxide particles such as alumina or mullite. The liquid matrix material may migrate between the ceramic fibers of the ceramic fiber bundle to form infiltrated ceramic fiber bundles. The ceramic fiber bundle may include ceramic fibers 18 of FIG. 2A.

Once the ceramic fiber bundles are infiltrated with ceramic matrix material, the infiltrated ceramic fiber bundles may be straightened (68). In some examples, the infiltrated ceramic fiber bundles may be passed through a die or other form having holes sized according to the desired thickness of CMC reinforcing pins 14. For example, the preceramic polymer-impregnated ceramic fiber bundle of FIG. 9 may be tow straightened to align the ceramic fiber bundles.

The straightened, infiltrated ceramic bundle may be dried (70) to remove any solvent or other dispersion medium used in infiltrating the ceramic fiber bundles. For example, the straightened, preceramic polymer-impregnated ceramic fiber bundle of FIG. 9 may be dried in a furnace or other heat source.

Once the infiltrated ceramic fiber bundles are dried, a matrix may be formed from the impregnated ceramic matrix material (72) to form a CMC rod, such as CMC rod 24 of FIG. 2B. The matrix may be formed by a variety of techniques, such as pyrolysis, melt infiltration, and sintering. In the example of FIG. 9, the dried, straightened, preceramic polymer-impregnated ceramic fiber bundle may be pyrolyzed. Once the CMC rod has been created, the CMC rod may be cut into CMC reinforcing pins (74).

Figure 10:
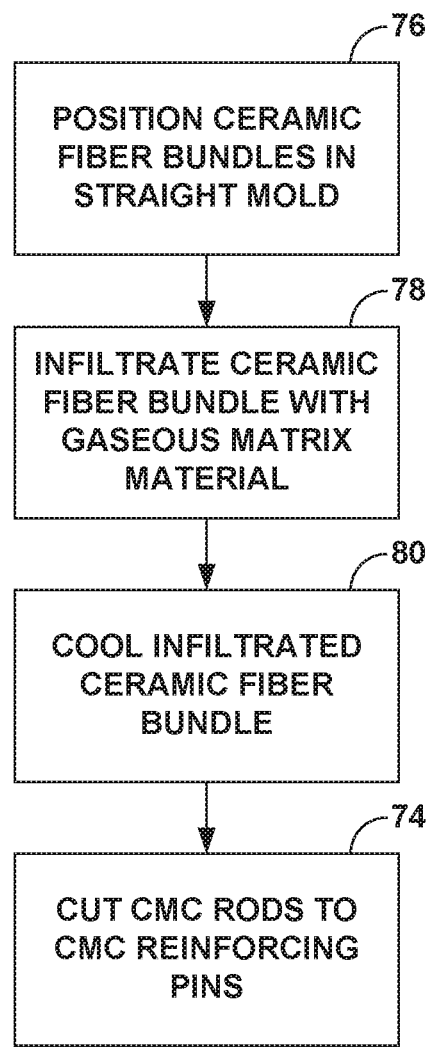
FIG. 10 is a flow diagram illustrating an example technique for manufacturing CMC reinforcing pins using chemical vapor infiltration.
Figure 11:
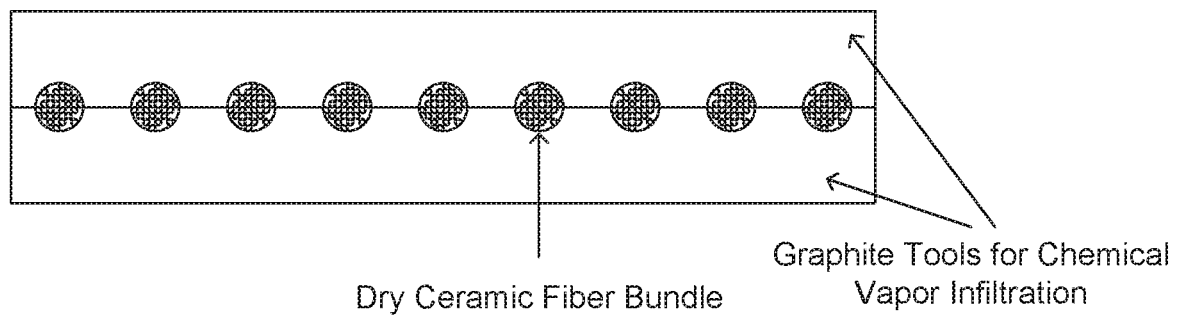
FIG. 11 is a conceptual and schematic cross-sectional diagram illustrating an example technique for manufacturing CMC reinforcing pins using chemical vapor infiltration.

In some examples, CMC reinforcing pins 14 of FIGS. 2A-C may be used in reinforced materials for articles that experience great thermal shock for which manufacture of CMC reinforcing pins 14 through liquid infiltration may not be suitable. FIG. 10 is a flow diagram illustrating an example technique for manufacturing CMC reinforcing pins using chemical vapor infiltration. FIG. 11 is a conceptual and schematic cross-sectional diagram illustrating an example mold for manufacturing CMC reinforcing pins using chemical vapor infiltration.

The technique may include positioning a ceramic fiber bundle in a straight mold (76). For example, ceramic fiber bundles may be laid in a straight mold having the desired shape of CMC reinforcing pins 14. For example, FIG. 11 illustrates dry ceramic fiber bundles positioned in graphite tools that form a straight mold for the dry ceramic fiber bundles. The straight mold may be placed, for example, in a reactor and the reactor filled with gaseous matrix material.

The ceramic fiber bundle may be infiltrated with the gaseous matrix material (78) to form an infiltrated ceramic fiber bundle. The gaseous matrix material may deposit on the ceramic fibers of the ceramic fiber bundle to form a CMC rod. A variety of gaseous matrix materials may be used including, but not limited to: hydrocarbon gas, such as methane and propane, for a carbon matrix or coating; carbosilanes, such as methyltrichlorosilane ($CH_3SiCl_3$), for a silicon carbide matrix or coating; silanes, such as dichlorosilane and tetraethylorthosilicate, for a silicon matrix or coating; aluminum halides, such as aluminum chloride (AlCl$_3$), for an alumina (Al$_2$O$_3$) matrix or coating; metal halides, such as tungsten hexafluoride and titanium pentachloride; metal carbonyls, such as nickel carbonyl; any other precursor suitable for forming a selected coating; or the like. In some examples, the CMC substrate precursors are in liquid form. The CMC rod may be cooled (80) and cut (74).

Figure 12:
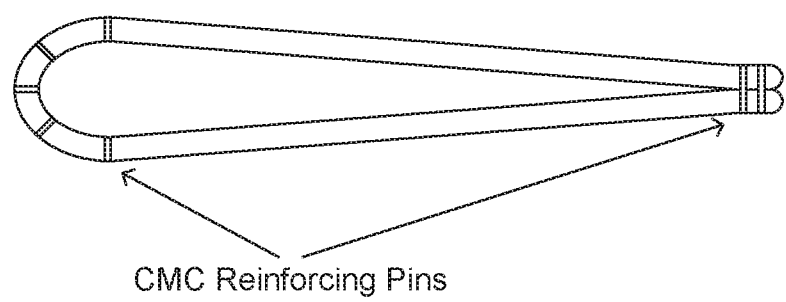
FIG. 12 is a conceptual and schematic cross-sectional diagram illustrating an example article that includes a CMC substrate and a plurality of CMC reinforcing pins.

CMC articles formed from reinforced material described above, such as CMC parts and coatings, may be used in a variety of applications, such as combustor lines, turbine blades, turbine shrouds, turbine vanes, and turbine flaps and seals. FIG. 12 is a conceptual and schematic cross-sectional diagram illustrating an example article that includes a CMC substrate and a plurality of CMC reinforcing pins. The CMC reinforcing pins may be placed at locations that may be subject to high stress, such as curved sections and sections requiring adhesion.

Various examples have been described. These and other examples are within the scope of the following claims.

What is claimed is:

1. A method comprising:
    inserting a plurality of ceramic matrix composite (CMC) reinforcing pins into a major surface of a ceramic fiber preform, wherein each CMC reinforcing pin of the plurality of CMC reinforcing pins defines a respective long axis, and wherein, as the plurality of CMC reinforcing pins are inserted into the major surface, the respective long axes are oriented at an angle substantially perpendicular to the major surface;
    forming a matrix of material within pores of the ceramic fiber preform to form a CMC component, wherein the matrix of material substantially surrounds the ceramic fiber preform and at least a portion of each respective CMC reinforcing pin; and
    forming a coating on the major surface of the CMC component, wherein the coating comprises at least one of an environmental barrier coating (EBC), a thermal barrier coating (TBC), a calcia-magnesia-alumino-silicate (CMAS) resistant layer, or an abradable coating,
    wherein a first section of at least one CMC reinforcing pin of the plurality of CMC reinforcing pins is embedded in the coating,
    wherein a second section of the at least one CMC reinforcing pin of the plurality of CMC reinforcing pins is embedded in the CMC component,
    wherein the plurality of CMC reinforcing pins comprises a first average pin spacing along an x-axis of the major surface and a second average pin spacing along a y-axis of the major surface, and
    wherein the first average pin spacing is different from the second average pin spacing.

2. The method of claim 1, wherein each respective CMC reinforcing pin of the plurality of CMC reinforcing pins includes ceramic fibers oriented substantially parallel to a lateral surface of the respective CMC reinforcing pin.

3. The method of claim 1, further comprising fabricating the plurality of CMC reinforcing pins.

4. The method of claim 3, wherein fabricating each CMC reinforcing pin of the plurality of CMC reinforcing pins comprises:
    infiltrating a ceramic fiber bundle with liquid matrix material;
    straightening the ceramic fiber bundle; and
    forming a matrix from the liquid matrix material.

5. The method of claim 3, wherein fabricating each CMC reinforcing pin of the plurality of CMC reinforcing pins comprises:
    positioning a ceramic fiber bundle in a straight mold;
    infiltrating the ceramic fiber bundle with gaseous matrix material; and
    cooling the ceramic fiber bundle.

6. The method of claim 1, wherein the plurality of CMC reinforcing pins are inserted partially into the major surface.

7. The method of claim 1, wherein the plurality of CMC reinforcing pins has an average spacing between 2 to 10 times a diameter of a CMC reinforcing pin in the plurality of CMC reinforcing pins.

8. The method of claim 1, wherein at least one CMC reinforcing pin of the plurality of CMC reinforcing pins has a length between about 0.05 and about 10 mm.

9. The method of claim 1, wherein at least one CMC reinforcing pin of the plurality of CMC reinforcing pins has a diameter between about 0.1 and about 1 mm.

10. The method of claim 1, wherein the ceramic fiber preform and the plurality of CMC reinforcing pins comprise a reinforcement comprising SiC and a matrix material comprising SiC.

11. A ceramic matrix composite (CMC) article comprising:
    a CMC substrate defining a major surface;
    a plurality of CMC reinforcing pins at least partially embedded in the CMC substrate, wherein each CMC reinforcing pin of the plurality of CMC reinforcing pins defines a respective long axis, and wherein the respective long axes are oriented at an angle substantially perpendicular to the major surface of the CMC substrate; and
    a coating on the major surface of the CMC substrate, wherein the coating comprises at least one of an environmental barrier coating (EBC), a thermal barrier coating (TBC), a calcia-magnesia-alumino-silicate (CMAS) resistant layer, or an abradable coating,
    wherein a first section of at least one CMC reinforcing pin of the plurality of CMC reinforcing pins is embedded in the coating,
    wherein a second section of the at least one CMC reinforcing pin of the plurality of CMC reinforcing pins is embedded in the CMC substrate,
    wherein the plurality of CMC reinforcing pins comprises a first average pin spacing along an x-axis of the major surface and a second average pin spacing along a y-axis of the major surface, and
    wherein the first average pin spacing is different from the second average pin spacing.

12. The CMC article of claim 11, wherein each CMC reinforcing pin of the plurality of CMC reinforcing pins includes ceramic fibers oriented substantially parallel to a lateral surface of each respective CMC reinforcing pin and extending substantially a length of each respective CMC reinforcing pin.

13. The CMC article of claim 11, wherein the plurality of CMC reinforcing pins has an average spacing between 2 to 10 times a diameter of a CMC reinforcing pin in the plurality of CMC reinforcing pins.

14. The CMC article of claim 11, wherein at least one CMC reinforcing pin of the plurality of CMC reinforcing pins has a length between about 0.05 and about 10 mm.

15. The CMC article of claim 11, wherein at least one CMC reinforcing pin of the plurality of CMC reinforcing pins has a diameter between about 0.1 and about 1 mm.

16. The CMC article of claim 11, wherein the CMC substrate and the plurality of CMC reinforcing pins comprise a reinforcement comprising SiC and a matrix material comprising SiC.

17. The CMC article of claim 11, wherein the plurality of CMC reinforcing pins have a pin spacing between about 2 to about 10 times a diameter of at least one CMC reinforcing pin of the plurality of CMC reinforcing pins.

18. The CMC article of claim 11, wherein a matrix material of the plurality of reinforcing pins comprises a different composition than a matrix material of the CMC substrate.

19. The CMC article of claim 11, wherein a matrix material of the plurality of reinforcing pins is a pyrolyzed non-oxide ceramic matrix material.

\* \* \* \* \*